US006671326B1

United States Patent
Tortelier

(10) Patent No.: US 6,671,326 B1
(45) Date of Patent: Dec. 30, 2003

(54) METHOD OF DETECTING, BLIND, THE CODING MODE USED FOR DIGITAL DATA

(75) Inventor: Patrick Tortelier, Clichy (FR)

(73) Assignee: France Telecom, Paris (FR)

( * ) Notice: Subject to any disclaimer, the term of this patent is extended or adjusted under 35 U.S.C. 154(b) by 717 days.

(21) Appl. No.: 09/584,224

(22) Filed: May 31, 2000

(30) Foreign Application Priority Data

Jun. 2, 1999 (FR) .......................................... 99 06954

(51) Int. Cl.[7] .................................................. H04L 5/12
(52) U.S. Cl. ...................... 375/262; 375/341; 714/780; 714/785; 714/795
(58) Field of Search ................................ 375/262, 265, 375/324, 341; 714/786, 792, 793, 794, 795, 781, 784, 785, 780, 774, 796, 752

(56) References Cited

U.S. PATENT DOCUMENTS

| 5,230,003 | A | | 7/1993 | Dent et al. ................. 371/43 |
| 5,453,997 | A | | 9/1995 | Roney, IV ................. 371/41 |
| 5,563,894 | A | * | 10/1996 | Fujiwara et al. ........... 714/785 |
| 5,566,206 | A | | 10/1996 | Butler et al. .............. 375/225 |
| 5,936,972 | A | * | 8/1999 | Meidan et al. ............ 714/712 |
| 6,009,552 | A | * | 12/1999 | Ariel et al. ............... 714/780 |
| 6,031,875 | A | * | 2/2000 | Im ........................... 375/262 |
| 6,038,696 | A | * | 3/2000 | Chouly et al. ............. 714/786 |
| 6,058,500 | A | * | 5/2000 | DesJardins et al. ........ 714/781 |
| 6,145,110 | A | * | 11/2000 | Khayrallah ................ 714/752 |

FOREIGN PATENT DOCUMENTS

| WO | WO 95/15033 | 6/1995 |
| WO | WO 98/04047 | 1/1998 |

OTHER PUBLICATIONS

Ohashi et al., "Development of a Variable Rate Syndrome Sequential Decoder Based on a Stack Algorithm," *IEEE Global*, vol. 1, pp. 0131–0135 (1988).

French Search Report dated Jan. 18, 1999, PCT Appl. PCT/FR98/02468.

* cited by examiner

*Primary Examiner*—Don N. Vo
*Assistant Examiner*—Khanh Cong Tran
(74) *Attorney, Agent, or Firm*—Gardner Carton & Douglas LLP

(57) ABSTRACT

A method of detecting, blind, the coding mode used to encode digital data, for data transmitted in frames of n bits, partially subjected to a convolutional coding. A soft syndrome value is calculated over a sequence of bits representative of a transmission error probability in these bits, and a likelihood value $V(\alpha,\beta)$, where $\alpha$, $\beta$ denote the number of coded bits and non-coded bits respectively, is then calculated on the basis of the mean value m and the variance $\sigma$ of the distribution of the absolute soft syndrome values. The likelihood value $V(\alpha,\beta)$ is maximised as a function of $\alpha$ or $\beta$ which makes it possible to determine the coding mode used on the basis of the corresponding values $\alpha$ or $\beta$.

4 Claims, 4 Drawing Sheets

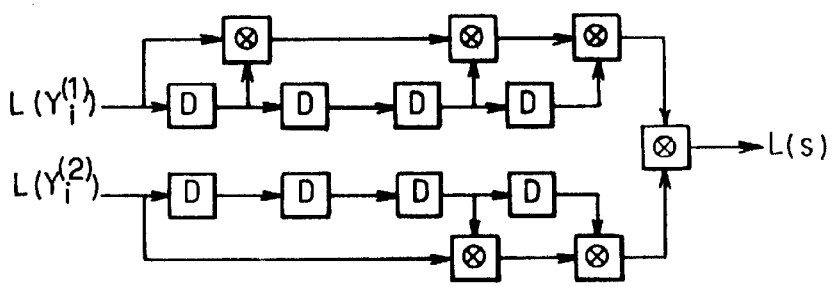
FIG.3a.
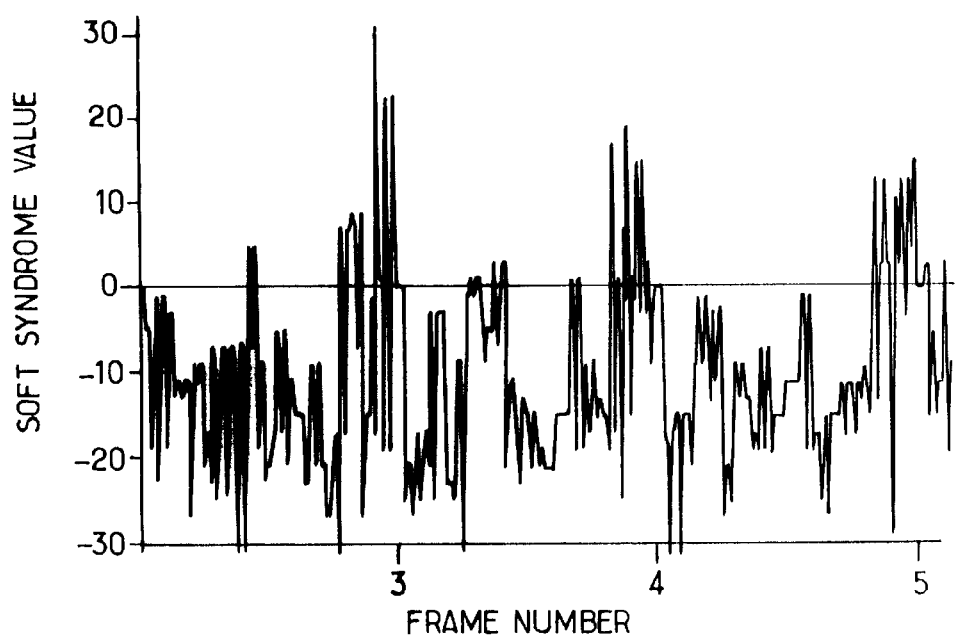
FIG.3b.
FIG.3c.

METHOD OF DETECTING, BLIND, THE CODING MODE USED FOR DIGITAL DATA

The invention relates to a method of detecting blind a mode used to encode digital data and can be applied to the transmission of encoded speech signals on a wireless-mobile channel.

With applications which transmit speech on a wireless-mobile channel at low rate, such as transmission of this type of signal at 13 bits/s from the GSM speech encoder, it is currently necessary to protect the transmitted data, on the one hand because the transmission channel is of mediocre quality and on the other because transmission errors have a subjective effect on the audio digital signal which very rapidly becomes unpleasant for the listener.

Since the line rate is fixed at 22.8 kbits/s for full rate GSM transmission or at 11.4 kbits/s for half rate GSM transmission, the fact that not all the bits of a data frame emitted by the voice encoder are of equal subjective importance is used as a means of protecting only part of this frame by using an encoding system of the convolutional coding type. At present, the 260 bits of a full-rate speech frame are split into two classes of protection: 182 bits of this frame are protected by convolutional encoding with a ½ output and the remaining 78 bits are transmitted without protection, the latter bits being regarded as the least sensitive. This system of applying a split into two categories of protection is rigid and does not depend on the quality of the wireless transmission channel.

The objective of the present invention is to implement a method of detecting blind, on reception, the mode by which digital data was encoded, so as to allow on emission, i.e. at the level of the encoding process, the system of sharing the overall transmission rate, which is assumed to be constant, between voice encoder and channel coding to be adapted so that if the transmission channel is good, the rate of the speech encoder is increased at the level of the voice coder and that of the channel encoding is reduced, given that the introduction of high redundancy by convolutional encoding is not indispensable, in order to improve the audio frequency quality of the transmitted signal, whereas, if the channel is poor, a switch is made to an encoding mode in which the intrinsic quality of the coding at the level of the voice coder is reduced to the benefit of the channel coding. With an operating mode of this type, it will be conceivable to maintain the continuity of the radio frequency link albeit with an audio frequency of an inferior quality.

Accordingly, and in accordance with one of the object of the invention, the aim is to provide a method that will allow the mode used to encode digital data to be detected blind at the level of any receiver and distinguished from a given number of coding modes of the convolutional type, it being possible for each coding mode to be characterised and distinguished on the basis of the number of bits coded or not coded in each frame making up the audio digital signal.

Another object of the present invention is to provide a method of detecting, blind, the mode used to encode digital data which obviates the need to transmit the coding mode used to the receiver, by means of a certain number of bits, this type of operating mode using a certain number of bits which can not be used to transmit data in the successive frames, which must also be subjected to a very robust form of convolutional coding to protect against transmission errors, without which the risk that decoding would be attempted on the basis of incorrect information relating to the coding mode used would be unacceptable.

The method proposed by the invention of detecting, blind, a mode used to encode digital data transmitted in frames, in which each current frame comprises n bits and consists of a first given number of bits coded by a coding system and a second given number of non-coded bits, the number of coded bits and the number of non-coded bits which define the coding mode being chosen from a finite set of possibilities, is noteworthy in that it consists in computing a soft or flexible syndrome value representative of the transmission error probability for the bits in question over a sequence of bits for at least one frame transmitted, computing, on the basis of parameters of the mean and variance type relating to the distribution of these soft syndrome values, a value of probability, depending on the number of coded $\alpha$ or non-coded bits $\beta = n - \alpha$, that $\alpha$ bits and soft syndrome values and $\beta$ bits and soft syndrome values will correspond to a coded part or non-coded part respectively, these numbers $\alpha$ and $\beta$ being representative of the possible coding mode used, maximising this probability value as a function of one of the numbers representing the possible coding mode used, which will allow the actual coding mode used to transmit this digital data to be detected for the maximum value of this probability value.

The method proposed by the invention can be applied to the transmission of digital data by packets on a channel having characteristics which vary over time, such as radio, Hertzian or satellite channels.

It will be more readily understood from the appended drawings, of which FIGS. 1a and 1b illustrate the prior art and:

FIG. 2 gives a general flow chart of the steps involved in implementing the method proposed by the invention as a means of detecting, blind, the mode used to code digital data;

FIG. 3a shows an operator used to compute a soft syndrome value, which is the product of two Log-probability values $L_1$ et $L_2$;

FIG. 3b shows a graph of how soft syndrome values are calculated in an example, which is not restrictive, of a convolutional coding system with an output R=½ based on specific generator polynomials;

FIG. 3c shows the soft syndrome values for successive frames obtained for a Gaussian white channel using the convolutional coding illustrated in FIG. 3b;

Before turning to the description proper of the method proposed by the invention as a means of detecting blind the mode used to code digital data, various technical aspects relating to the convolutional coding process will be explained with reference to FIG. 1a and 1b as well as the way in which transmission errors are picked up by computing an error syndrome.

Figure 1A:
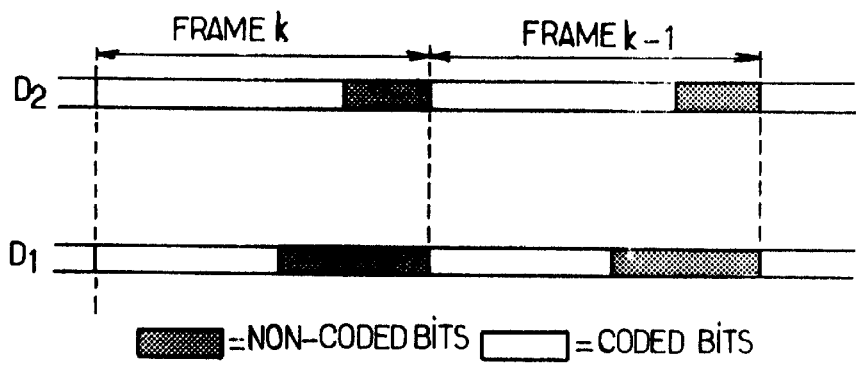
Figure 1B:
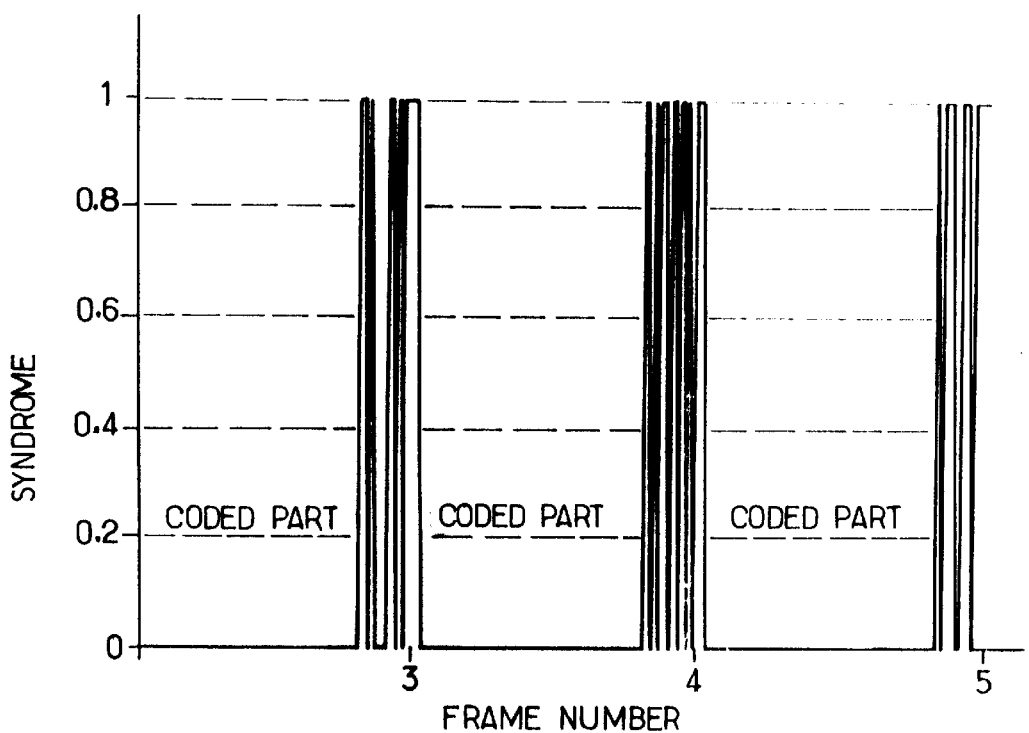

Turning to FIG. 1a, it will be recalled that the process of convolutional coding currently used is as follows.

The digital data to be encoded arrives in packets of a length $L = n_1 + n_2$ bits. This data is separated into two parts, the first $n_1$ bits, optionally accompanied by a certain number of bits of value 0, known as tail bits, being protected by a process of convolutional coding which, by way of example although this is not restrictive, is assumed to have an output of R=½. The remaining $n_2$ bits of the packet are not subjected to a coding process. The coded bits are transmitted before the non-coded bits.

The transmitted bits, referred to as frames, are made up of an alternating series of bits from the convolutional encoder and bits which have not been subjected to an encoding process and are therefore not protected thereby. Each frame has a periodic pattern of length $P=2n_1+n_2$ if no extra bit or tail bit has been added, or $P=2(n_1+K)+n_2$ if a number K of tail bits has been added, the value K being determined by the degree of generator polynomials in the convolutional code.

Taking as an example three possible convolutional coding modes for a half-rate version of a GSM speech encoder and respective rates $D_1=7.8$, $D_2=6.5$ and $D_3=5$ kbits/s, three convolutional coding modes might consist, for example, of:

64½ coded bits, 92 non-coded bits with a rate $D_1$;

90½ coded bits, 40 non-coded bits with a rate $D_2$;

20⅓ coded bits, 80½ coded bits with a rate $D_3$.

In the three examples of convolutional coding mentioned above constituting a finite number of coding possibilities which might be used, it may be seen that an increasing proportion is assigned to the channel coding when switching from rate $D_1$ to rate $D_3$. The first two examples of rates $D_1$ and $D_2$ correspond to a convolutional coding with ½ output.

With reference to the examples of coding modes likely to be used for the first two rates $D_1$ and $D_2$ and for transmitting a half rate GSM speech signal, the convolutional code with a ½ output will have the following generator polynomials:

$G_1 = 1+D^3+D^4$ $G_2 = 1+D+D^3+D^4$.

In this example, the order of the generator polynomials is K=4. If tail bits are added to the coded bits, the period is the same in both cases, i.e. for the above-mentioned rates $D_1$ and $D_2$. The value of the period is:

$P=2\times(64+4)+92=2\times(90+4)+40=228$ bits as illustrated in FIG. 1a.

Provided there is no transmission error in the frames coded using one of the coding modes illustrated in FIG. 1a, for example, a decoder for the convolutional code used will see arriving, alternately, bits from the corresponding encoder with no errors and bits which are not from this encoder and which will therefore be deemed to have been transmitted at an error rate of $p=½$.

These two specific situations are sufficiently different for a distinction to be made between them as they are received. A distinction can be made between them without having to apply the decoding process by using a system to compute an error syndrome value, this error syndrome being a value associated with the bits received and representative of the transmission error probability. This error syndrome value will be referred to hereafter as a hard syndrome value and will be explained below.

For a series of bits $\{x_0, x_1, \ldots x_n\}$ at the input of the convolutional coding process with generator polynomials verifying the equation:

$$G_1(D) = \sum_{i=0}^{K} G_{1,i} D^i, \quad G_2(D) = \sum_{i=0}^{K} G_{2,i} D^i$$

the sequence of coded bits obtained after applying the coding process will be written:

$$Y(D) = \begin{pmatrix} Y_1(D) \\ Y_2(D) \end{pmatrix} = X(D) \begin{pmatrix} G_1(D) \\ G_2(D) \end{pmatrix}$$

$$X(D) = \sum_{n \geq 0} x_n D^n$$

The hard syndrome value is defined by the equation:

$$S(D) = Y_1(D) G_2(D) \oplus Y_2(D) G_1(D)$$

The symbol $\oplus$ denotes the exclusive OR operation. This hard syndrome value is zero if there is no transmission error. Otherwise, if the binary errors on the two bit streams emitted by the convolutional coding process and transmitted are expressed by $E_1(D)$ and $E_2(D)$, each bit stream being generated by one of the generator polynomials, then the above-mentioned hard syndrome value is no longer zero and indicates the existence of transmission errors, which is why it is referred to as a hard syndrome value.

In accordance with one characteristic of the hard syndrome values, it should be pointed out that the syndrome value depends only on binary errors introduced into the two bit streams obtained. In the case of the errors $E_1(D)$ and $E_2(D)$ mentioned above, the hard syndrome value verifies equation (1):

$$S(D) = E_1(D) G_2(D) \oplus E_2(D) G_1(D) \tag{1}$$

The hard syndrome value for a sequence of n successive bits therefore verifies the equation (2):

$$s_n = \sum_{i=0}^{K} E_{n-i}^{(1)} G_{2,i} \oplus \sum_{i=0}^{K} E_{n-i}^{(2)} G_{1,i} = u \oplus v \tag{2}$$

This syndrome value is represented by the exclusive OR product of the sum of w' error terms, where w' denotes the number of non-zero coefficients of the polynomial $G_2(D)$, and w" error terms, where w" denotes the number of non-zero coefficients of the polynomial $G_1(D)$, these error terms being denoted by u and v respectively, as set out in equation (2).

It should be noted that w' and w" denote the Hamming weight of the generator polynomial $G_2(D)$ and the generator polynomial $G_1(D)$ respectively.

It is therefore possible to compute the probabilities $p_1$ and $p_2$ of the sums of the errors terms u and v being not zero.

These probabilities are written:

$$p_1 = Pr[u \neq 0] = \sum_{i\,impair} C_{w'}^i p^i (1-p)^{w'-i}$$

$$p_2 = Pr[v \neq 0] = \sum_{i\,impair} C_{w''}^i p^i (1-p)^{w''-i}$$

$i\,impair = i\,odd$

With reference to the principle of total probabilities, the probability of the hard syndrome value $s_n$ being different from 0 is given by the equation (3)

$$Pr(s_n \neq 0) = p_1(1-p_2) + p_2(1-p_1) \tag{3}$$

If the error rate p in the transmission channel is small, it may be said that:

$$p_1 \approx w'p, p_2 \approx w''p \rightarrow Pr(s_n \neq 0) \approx (w'+w'')p$$

If the error rate in the channel is close to ½, $p=½$, then $p_1=p_2=½$ and the probability of the syndrome value being different from 0 is equal to ½. Accordingly, it seems that the distinctive element of the coded parts and non coded parts in the flow of bits transmitted is the proportion of hard syndrome bits which are not zero, which is equal to ½ in the non-coded part, as shown in FIG. 1b.

Consequently, if the quality of the transmission channel is good, i.e. for an error rate p very much lower than 1, the coded and non-coded zones will be very markedly distinctive, merely on a check of said hard syndrome value. However, this is no longer the case on a channel of mediocre quality as in the case of a wireless transmission channel used for a mobile telephone for example, where the binary error rate is in the order of several percent. In such a situation, the probability of obtaining a syndrome bit that is not zero very soon becomes close to the value 0.5, this probability being in the form: (w'+w'')p where w' and w'' represent the Hamming weights of the generator polynomials mentioned above. For the coding process mentioned as an example earlier on in the description, the result is in the order of 7p and reaches a value close of 35% if p=0.05, such an error probability value being common on this type of transmission channel. In a case such as this, picking out a convolutional coding mode on the basis of the hard syndrome value seems to be particularly problematic and is therefore not easy to operate.

The method proposed by the present invention, by means of which this difficulty is eliminated, will be described with reference to FIG. 2.

Generally speaking, it should be pointed out that the method proposed by the invention can be used on a sequence of bits and in particular on each frame of n bits a described earlier in the description. In order to eliminate the above-mentioned ambiguity, the method proposed by the invention allows information to be obtained as to the reliability of the syndrome bits obtained.

Figure 2:
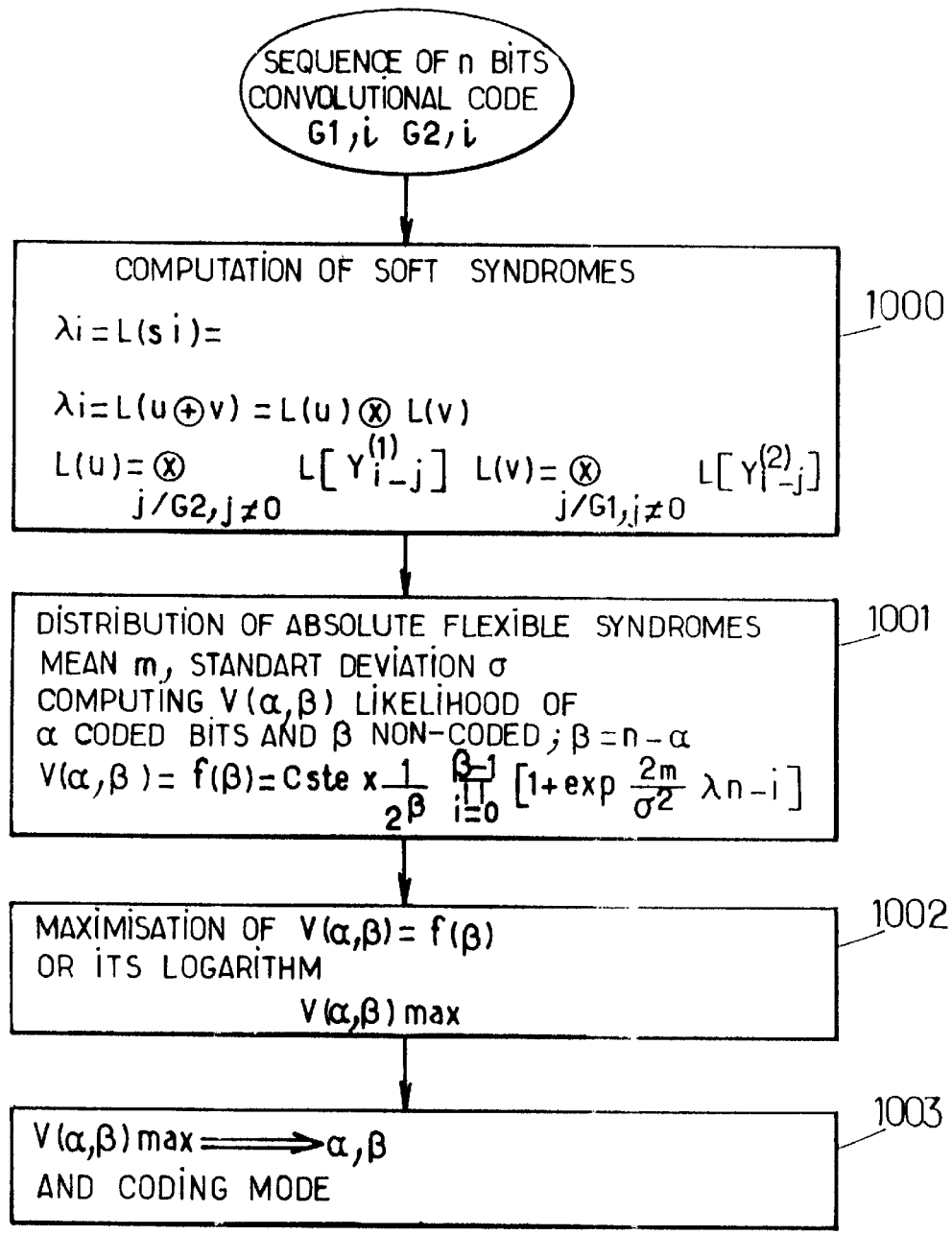

As illustrated in FIG. 2, it consists in computing a soft syndrome value for each sequence of bits at step 1000, this soft syndrome value representing the probability of the hard syndrome value mentioned earlier in the description.

Accordingly, for every value x at the input of the transmission channel and for every value y at the corresponding output of the demodulator, i.e. on reception, it being pointed out that the demodulator supplies real values at the output, the logarithmic probability, referred to as the Log-probability, of the value of the bit x conditional on the real value, denoted by L(x|y), is obtained by the equation:

$$L(x \mid y) = \ln \frac{Pr(x = 1 \mid y)}{Pr(x = 0 \mid y)}$$

The Log-probability value is defined as being the Neperian logarithm of the ratio of conditional probability of the value of the bit x=1 conditional on the value y to the conditional probability of the value of the bit x=0 conditional on this same value y.

Such a Log-probability value is a real value whose sign, positive or negative, allows a firm decision to be taken with regard to the value of the bit, i.e. x=0 or x=1. However, operating the above-mentioned decision results in a significant loss of important information given by the absolute value of the Log-probability, which indicates whether the two conditional probabilities are close, in which case the decision has a low reliability, whilst the value of the Log-probability L(x|y) being close to 0 or very different in the case of a decision of high reliability when |L(x|y)| is very high.

Inverting the equation allows the value of the bit x equal to the value 1 conditional on the real value y as well as the probability of this same value of the bit x equal to the value 0 conditional on this same value y to be written and expressed by the equation:

$$Pr(x = 1 \mid y) = \frac{e^{L(x|y)}}{1 + e^{L(x|y)}}, \quad Pr(x = 0 \mid y) = \frac{1}{1 + e^{L(x|y)}}$$

Furthermore, if $x_1$ and $x_2$ are two values of successive bits transmitted and having a respective Log-probability written $L_1$ and $L_2$ relative to the corresponding outputs of the demodulator, the value of the Log-probability of the exclusive OR product of the bit values x1 and $x_2$, values $z=x_1 \oplus x_2$, verifies the equation:

$$Pr(z = 1) = Pr(x_1 = 1)Pr(x_2 = 0) + Pr(x_1 = 0)Pr(x_2 = 1) =$$

$$\frac{e^{L1} + e^{L2}}{(1 + e^{L1})(1 + e^{L2})}$$

The Log-probability value of the exclusive OR product z of the two successive bits x1 and $x_2$ conditional on the values $y_1$ and $y_2$ at the output of the demodulator then verifies equation (4):

$$z = x_1 \oplus x_2 \Rightarrow L(z) = L_1 \otimes L_2 = \ln \frac{e^{L1} + e^{L2}}{1 + e^{L1} + e^{L2}} \quad (4)$$

In the equation above, the sign $\oplus$ denotes the product of the Log-probability values $L_1$ and $L_2$ for the corresponding bit values $x_1$ and $x_2$.

By applying the transformation $$\tanh \frac{z}{2} = \frac{e^z - 1}{e^z + 1},$$

equation (4) above is written by equation (5):

$$\tanh\left[\frac{L(x_1 \oplus x_2)}{2}\right] = -\tanh\left[\frac{L(x_1)}{2}\right]\tanh\left[\frac{L(x_2)}{2}\right] \quad (5)$$

Equation (5) above establishes an approximation of the Log-probability value of the exclusive OR product z of the two bit values $x_1$ and $x_2$, this approximation verifying equation (6):

$$L(z) \approx -\text{sgn}[L(x_1)] \times \text{sgn}[L(x_2)] \times \min\ [|L(x_1)|,|L(x_2)|] \quad (6)$$

In this equation, the symbol sgn indicates the sign of the expression between parentheses and the symbol min denotes the minimum value between two values in parentheses, i.e. between the absolute Log-probability values $L(x_1)$ and $L(x_2)$ of the successive bit values $x_1$ et $x_2$.

By a process of iteration, it can be established from equations (5) and (6) above that said Log-probability value can be computed for an exclusive OR product of any number of successive bit values $x_i$.

Accordingly, for any sequence of bit values $x_1$ to $x_n$ made up of a transmitted frame of the speech signal for example, the following equations are obtained:

$$\tanh\left[\frac{L(x_1 \oplus x_2 \oplus \ldots x_n)}{2}\right] = (-1)^{n-1} \prod_{i=1}^{n} \tanh\left[\frac{L(x_1)}{2}\right]$$

-continued $$L(x_1 \oplus x_2 \oplus \ldots x_n) = L(x_1) \otimes L(x_2) \ldots \otimes L(x_n) = \bigotimes_{i=1}^{n} L(x_1)$$

$$L(x_1 \oplus x_2 \oplus \ldots x_n) \approx (-1)^{n-1} \prod_{i=1}^{n} sgn[L(x_1)] \times \min_i \{|L(x_i)|\}$$

In the equations above, the symbol min represents the minimum value of the absolute value of the Log-probabilities of each bit $x_i$ in the bit sequence in question.

Expressing the Log-probabilities as an exclusive OR, also referred to as the modulo-2 sum of successive binary values or bits $x_i$ and the considerations outlined above allow the soft syndrome values to be computed by applying equation (2) mentioned earlier in the description at the demodulator output given that the soft syndrome value corresponds to the hard syndrome probability, this probability being expressed in the form of a Log-probability of the hard syndrome value.

In view of the above considerations, the soft syndrome value, the hard syndrome Log-probability value, verifies the equation (7):

$$L(s_n) = L(u \oplus v) = L(u) \otimes L(v) \quad (7)$$

$$L(u) = \bigotimes_{i/G2, i \neq 0} L[Y_{n-i}^{(1)}]$$

$$L(v) = \bigotimes_{i/G1, i \neq 0} L[Y_{n-i}^{(2)}]$$

Clearly, in equation (7) above, u and v denote the sum of the w' and w" error terms of equation (2). Accordingly, the hard syndrome Log-probability $L(S_n)$ equal to the Log-probability of the exclusive OR product of w' and w" of the error terms u and v is equal to the product of the Log-probabilities of these same sums of error term L(u) and L(v), the concept of product clearly being that corresponding to the product of the hyperbolic tangents or, as applicable, according to the approximation mentioned earlier in the description, taking account of the sign of the Log-probabilities and the minimum value of the absolute value of these same Log-probabilities.

In equation (7) above, it should also be pointed out that the symbols $i|G_{2,i\neq 0}$ and $i|G_{1,i\neq 0}$ represent the non-zero coefficients of the generator polynomials $G_2(D)$ and $G_1(D)$ of the convolutional coding and $Y_{n-i}^{(1)}$ and $Y_{n-i}^{(2)}$ represent the value of the successive coded bits of corresponding rank n−i.

The soft syndrome values may be computed by means of an operator as illustrated in FIG. 3a, the operation illustrated being executed in accordance with equation (4) on two values of successive bits, x1 and $x_2$, or as applicable by equation (6) in accordance with the approximation mentioned earlier in the description. In both cases, this operator is represented by the symbol ⊕, this operator allowing the value of the product of the Log-probabilities $L_1$ and $L_2$ in accordance with equation (4) or, as is the case, in accordance with the approximation of equation (6), to be matched with any variable at the input $L(x_1)$, $L(x_2)$.

An example of how these operators work in conjunction with a convolutional coding process at an output of R=½ with a generator polynomial $G_1=1+D^3+D^4$ and $G_2=1+D^3+D^4$ is illustrated in FIG. 3b. It should be pointed out that in said figure, each value of D indicates the corresponding value of the real variable of the generator polynomial $G_1$ or $G_2$, the multiplication operator being introduced in compliance with the presentation discussed earlier in the description with reference to FIG. 3a.

FIG. 3c represents the result of the soft syndrome values, for the convolution coding performed in FIG. 3b in a Gaussian white channel such as a radio transmission channel for example. The soft syndrome values are plotted on the ordinate as positive and negative values and the values of the frame number are plotted on the abscissa, the soft syndrome values being represented on three consecutive frames.

In accordance with the definition of the soft syndrome values given earlier in the description, the negative soft syndrome values correspond to firm decisions $x_i$=0. Turning to FIG. 3c, it is easy to see the non-coded regions of frames, for which the soft syndrome values are positive. However, in accordance with one remarkable aspect of the method proposed by the invention, the positive syndrome values located in the coded part of the frame have a significantly lower amplitude than the errors in the non-coded part.

Consequently, in accordance with one particularly advantageous aspect of the method proposed by the invention, this fact can be used at a step 1001 illustrated in FIG. 2, during which, on the basis of the distribution of soft syndrome values, this distribution having a mean value m and a variance type σ, a computation can be run for the probability V(α,β) that α bits of each frame are coded and β bits of this same frame are not coded.

Generally speaking, it should be pointed out that the mean value m and the variance σ of the distribution of soft syndrome values can be calculated on the basis of soft syndrome values for each bit $x_i$ making up the bit sequence stored in memory.

Figure 4:
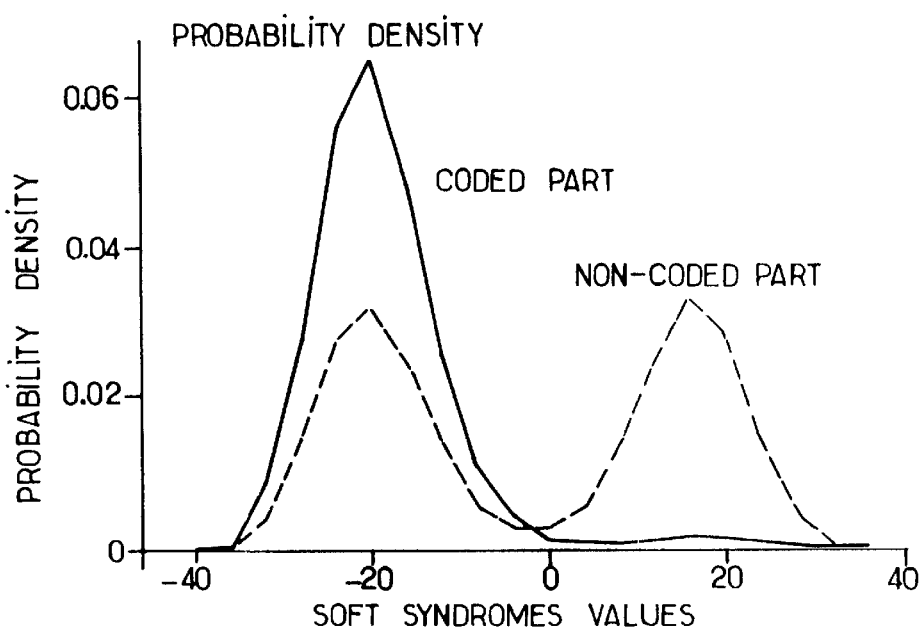
FIG. 4 shows, by way of illustration, a histogram of soft syndrome values for the coded parts and non-coded parts of successive frames, for a given signal-to-noise ratio of the digital signal carrying these frames.

In order to illustrate said operating mode at step 1001 more specifically and although it is not necessary to draw up a histogram of the soft syndrome values, such a histogram of the soft syndrome values is given in FIG. 4, purely by way of illustration. From this drawing, it may be seen that each histogram of soft syndrome values corresponds either to a Gaussian or substantially Gaussian law centred around a negative value for the coded part, the value −20 in FIG. 4, or a superimposition of two substantially Gaussian laws of opposite mean values for the non-coded part. By observing said distribution of soft syndrome values for the coded and non-coded parts, a distinction can be made between the proportion of bits which were coded by convolutional coding in the frame, which means that the coding mode effectively used can be determined. With regard to FIG. 4, it should be pointed out that the probability density is plotted on the ordinate and the soft syndrome, real value, is plotted on the abscissa, the coded part being represented by a continuous line and the non-coded part by a broken line.

The respective laws of distribution of the soft syndrome values for the coded and non-coded part are written N(x,−m,σ) for the coded part and $$\frac{1}{2}[N(x-m, \sigma) + N(x+m, \sigma)]$$

for the non-coded part where m is the absolute value of the mean value and $$N(x; m, \sigma) = \frac{1}{\sigma\sqrt{2\pi}} e^{\frac{(x-m)^2}{2\sigma^2}}$$

is the normal or Gaussian law of mean m and variance σ. The mean and variance a parameters can be measured from the soft syndrome values stored in memory, as will be described later on in the description with reference to a process of identifying parameters in a mixture of Gaussian laws.

Step 1001 therefore consists in computing, on the basis of said parameters of the mean value m and variance σ, a probability that α bits will be coded and β bits not coded in the observed sequence of soft syndromes, this value of probability being expressed V(α,β) by way of simplification. In order to simplify the expression, $\lambda_i = L(S_i)$ used, where i=1 to n, to denote the soft syndrome values at the output of the operator system as illustrated in FIG. 3*a*, although this system may include any generator polynomials and is therefore not restricted to the mode illustrated in FIG. 3*a*. Assuming that a soft syndromes correspond to a coded part and β=n−α syndromes correspond to a non-coded part, the probability of the observed sequence of soft syndromes V(α,β) verifies the equation:

$$Pr[\{\lambda_i\}|\alpha] = \prod_{i=1}^{\alpha} N(\lambda_i; -m) \times \prod_{i=0}^{\beta-1} \frac{1}{2}[N(\lambda_{n-i}; -m) + N(\lambda_{n-i}; m)]$$

$$= \prod_{i=1}^{n} N(\lambda_i; -m) \times \frac{1}{2^{\beta}} \prod_{i=0}^{\beta-1} \left[1 + \frac{N(\lambda_{n-i}; m)}{N(\lambda_{n-i}; -m)}\right]$$

Generally speaking, the probability of the observed sequence of soft syndromes V(α,β) in fact corresponds to the probability of the sequence of i=1 to n soft syndrome values conditional on the value α.

This probability is equal to the product of the probability densities of the soft syndrome values $\lambda_i$ for the coded part, the probability densities being determined for i=1 to α in accordance with the normal law N($\lambda_i$,−m) by the product of the probability densities of the β soft syndromes in accordance with the normal law ½ [N($\lambda_{n-i}$,−m) +N ($\lambda_{n-i}$,m)].

In the equation above, by replacing the probable density value with its value as a function of the laws of distribution in accordance with said normal laws, it is possible to obtain the likelihood value for the observed sequence of sort syndromes which verifies the equation (8)

$$V(\alpha, \beta) = f(\beta) = Pr[\{\lambda_i\}|\beta] = Cste \times \frac{1}{2^{\beta}} \prod_{i=0}^{\beta-1} \left[1 + \exp\left(\frac{2m}{\sigma^2}\lambda_{n-1}\right)\right]; \quad (8)$$

$$\beta = n - \alpha$$

In this equation (8), the likelihood value is reduced to the function of the parameter β only because of the linear dependence between β, α and n, β=n−α.

Said step 1001 is then followed by a step 1002, as illustrated in FIG. 2, which consists in maximising the likelihood value of the observed sequence of soft syndromes as a function of the parameter α or the parameter β, taking account of what was said above.

In practice, due to the fact that there is a finite number of possibilities of coding modes, the three coding modes for the rates $D_1$, $D_2$, $D_3$ mentioned earlier in the description, corresponding to three possible numbers of non-coded bits $\beta_1$, $\beta_2$, $\beta_3$ and corresponding soft syndrome values, the operation of maximising the likelihood value will then consist in choosing the β value from among the values $\beta_1$, $\beta_2$, $\beta_3$ which maximises the likelihood value V(α,β)=f(β) or its logarithm, as is the case.

The logarithm of said value then verifies equation (9):

$$\log[f(\beta)] = Cste + \sum_{i=0}^{\beta-1} \log\left[1 + \exp\left(\frac{2m}{\sigma^2}\lambda_{n-1}\right)\right] - \beta \times \log(2) \quad (9)$$

The criterion for the decision relating to the chosen value of β corresponds to that which maximises the value of f(β) or its logarithm, in accordance with equation (10):

$$\hat{\beta} = \beta_i \rightarrow \log[f(\beta_j)] < \log[f(\beta_i)] \forall j \neq i \quad (10)$$

In this equation, $\beta_i$ denotes the chosen value and $\beta_j$ denotes any value of β belonging to the set of values of β, i.e. the set of coding values different from the value $\beta_i$.

Figure 5:
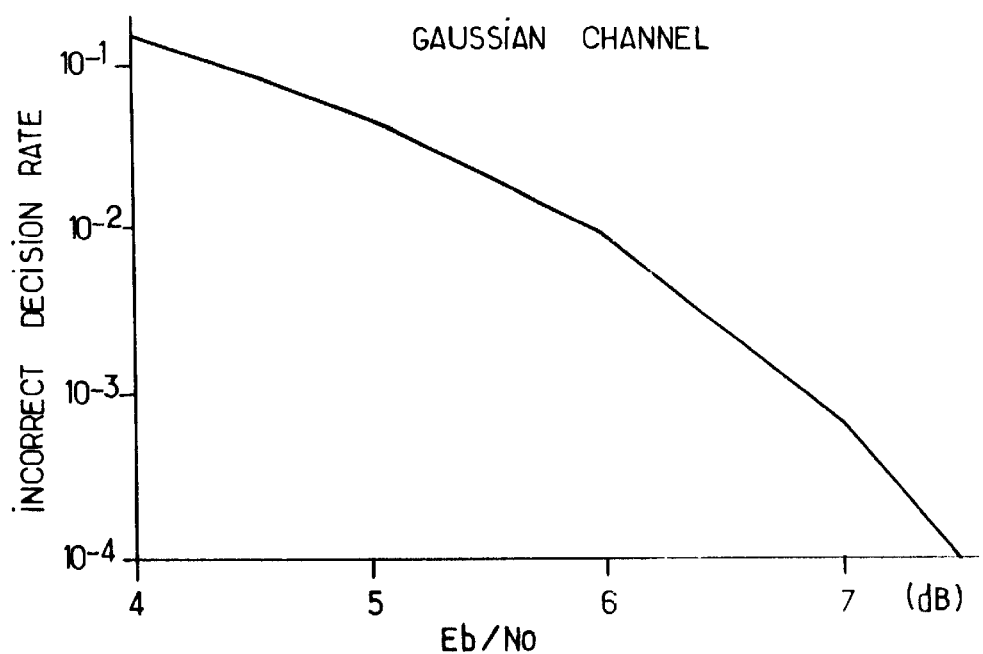
FIG. 5 is a diagram showing error detection rates for the convolutional code selected from a given number of possible convolutional codes equal to 2, as a function of the value of the signal-to-noise ratio of the digital signal.

FIG. 5 shows the result of a simulation implementing the method proposed by the invention for two possible codes between which a distinction must be made. The result illustrated is an incorrect decision rate corresponding to an incorrect probability decision, an incorrect decision corresponding to the wrong choice of coding actually used, as a function of the signal-to-noise ratio of the speech signal. The axis of the ordinates is graded by percentage values and the axis of the abscissa by signal-to-noise ratio in decibels.

As may be seen from FIG. 5, the method proposed by the invention may sometimes lead to an incorrect decision if the signal-to-noise ratio is low. In the case of an incorrect decision, the corresponding decoding will necessarily generate an incorrect result, if only by observing the change in the smallest metric of the Viterbi decoder of the channel encoder. In such a situation, the received frame can be declared as bad, returning the message BFI: Bad Frame Indication. However, this result can be anticipated because in such a case, the likelihood values of the assumptions in question are close, which means that there is greater uncertainty as to the choice and the existence of an incorrect result can therefore be predicted.

Different operating modes which can be used to determine the mean and variance parameters of probability laws consisting of mixtures of Gaussian laws are set out below:

The law of probability for a random Gaussian variable x of mean m and variance $\sigma^2$ is written:

$$p_x(x) = N(x; m, \sigma) = \frac{1}{\sigma\sqrt{2\pi}} e^{\frac{(x-m)^2}{2\sigma^2}}$$

A check is then run to verify that the law of probability Y=|x| is given by:

$$p_Y(y) = \begin{cases} 0 & , y < 0 \\ p_x(y) + p_x(-y) & , y \geq 0 \end{cases}$$

Given that:

$$N(-x; m,\sigma) = N(x; -m,\sigma)$$

$$y \geq 0 \rightarrow p_y(y) = N(y, -m,\sigma) + N(y, +m,\sigma)$$

If the random variable x is a mixture of two Gaussian laws of the same variance but opposite means, the law:

$$p_x(x) = \lambda N(x, m, \sigma) + (1-\lambda) N(x, -m, \sigma)$$

where $0 \leq \lambda \leq 1$, hence the law of probability $y=|x|$, is also given by the same expression:

$$p_Y(y) = \begin{cases} 0 & , y < 0 \\ \dfrac{1}{\sigma\sqrt{2\pi}} \left\{ e^{-\frac{(y-m)^2}{2\sigma^2}} + e^{-\frac{(y+m)^2}{2\sigma^2}} \right\} & , y \geq 0 \end{cases}$$

This law is also written in the following form for $y \geq 0$:

$$p_Y(y) = \frac{1}{\sigma}\sqrt{2/\pi}\, e^{-\frac{x^2+m^2}{2\sigma^2}} \cosh\left(\frac{my}{\sigma^2}\right)$$

Consequently, the law of probability of the absolute value of two opposite Gaussian mean values and the same variance does not depend on the proportion of $\lambda$ in the mixture. The above characteristic is put to use below as a means of identifying m, which is assumed to be $>0$, and the variance. For $\{x_1, x_2, \ldots, x_n\}$, the law X is applied as a whole and for $\{y_1=|x_1|, \ldots, y_n=|x_n|\}$, the absolute values of these samples. Accordingly, the parameters m and $\sigma$ are sought which maximise the following quantity:

$$Pr[\{y_i\} \mid m, \sigma] = \prod_{i=1}^{n} Pr[y_i \mid m, \sigma]$$

i.e. equation (11):

$$Pr[\{y_i\} \mid m, \sigma] = \prod_{i=1}^{n} \frac{1}{\sigma}\sqrt{2/\pi}\, e^{-\frac{y_i^2+m^2}{2\sigma^2}} \cosh\left(\frac{my_i}{\sigma^2}\right)$$

The equation above incorporates a product of hyperbolic cosines. It is known that:

$$\cosh(a)\cosh(b) = \frac{1}{2}[\cosh(a+b) + \cosh(a-b)]$$

$$= \frac{1}{4}[\cosh(a+b) + \cosh(a-b) + \cosh(-a+b) + \cosh(-a-b)]$$

making use of the fact that $\cosh(x)$ is an even function. The computation can be continued in order to verify that:

$$\cosh(a)\cosh(b)\cosh(c) =$$

$$\frac{1}{8}\begin{bmatrix} \cosh(a+b+c) + \cosh(a+b-c) + \cosh(a-b+c) + \\ \cosh(a-b-c) + \cosh(-a+b+c) + \cosh(-a+b-c) + \\ \cosh(-a-b+c) + \cosh(-a-b-c) \end{bmatrix}$$

where the eight signed combinations $\pm a \pm b \pm c$ are taken into account. By a recursive procedure, it can be established that:

$$\prod_{i=1}^{n} \cosh(x_1) = \frac{1}{2^n} \sum \cosh(\pm x_1 \pm x_2 \ldots \pm x_n)$$

where the sum is extended to all combinations of the signs. As a result of this identity, equation (11) can be written in the form of equation (12):

$$Pr[\{y_i\} \mid m, \sigma] \approx$$

$$(2/\pi)^{n/2} \sigma^{-n} \exp\left(-\frac{\sum_i (x_i^2 + m^2)}{2\sigma^2}\right) \times \frac{1}{2^n} \sum \cosh\frac{m}{\sigma^2}(\pm x_1 \pm x_2 \ldots \pm x_n)$$

The dominant term of the sum of hyperbolic cosines is obtained for the combination:

$$\text{sgn}((x_1)x_1 + \ldots + \text{sgn}(x_n)x_n = |x_1|+|x_2|+ \ldots +|x_n|$$

so that equation (12) can be approximated by:

$$Pr[\{y_i\} \mid m, \sigma] \approx$$

$$(2/\pi)^{n/2} \sigma^{-n} \exp\left(-\frac{\sum_i (x_i^2 + m^2)}{2\sigma^2}\right) \times \frac{1}{2^n} \times \exp\frac{m}{\sigma^2}(|x_1|+|x_2| \ldots |x_n|)$$

The parameters m and $\sigma$ which render this quantity maximum will then be:

$$\begin{cases} m = \dfrac{1}{n}\sum_{i=1}^{n} |x_i| \\ \sigma = \dfrac{1}{n}\sum_{i=1}^{n} (|x_i| - m)^2 \end{cases}$$

Said approximation is therefore justified.
The proportion $\lambda$ of the mixture can be identified on the basis of the same definition of the mixture:

$$P_x(x) = \lambda N(x,m,\sigma) + (1-\lambda)N(x,-m,\sigma)$$

The mean value of the random variable x is given by:

$$E[X] = \lambda m + (1-\lambda)(-m) = (2\lambda-1)m.$$

Consequently, $\lambda$ is derived by:

$$\lambda = \frac{1}{2}\left(1 + \frac{E[X]}{m}\right) \approx \frac{1}{2}\left(1 + \frac{\sum_{i=1}^{n} x_i}{\sum_{i=1}^{n} |x_i|}\right)$$

in the specific case where a decision has to be made as to whether a balanced mixture exists, i.e. $\lambda=0.5$, or, in the case of a pure situation where $\lambda=0$ or $\lambda=1$, it is sufficient to compare $\lambda$ with the thresholds 0.25 and 0.75:

$$\lambda = \begin{cases} 0, & \lambda < 0.25 \\ 0.25, & 0.25 \leq \lambda < 0.75 \\ 1, & 0.75 \leq \lambda \end{cases}$$

What is claimed is:
1. A method of detecting, blind, a coding mode by which digital data transmitted in frames was encoded, each current frame comprising n bits and consisting of a given first number of bits coded by convolutional coding and a second given number of non-coded bits, the number of coded bits and the number of non-coded bits which define said coding mode being selected from a finite set of possibilities, wherein said method consists in, for at least one transmitted frame:

computing for a sequence of bits a soft syndrome value representative of the transmission error probability for the bits of said sequence of bits;

on the basis of the parameters of the mean value and variance of the distribution of these soft syndrome values, computing a likelihood value, which is a function of the number of coded bits $\alpha$ or non-coded bits $\beta=n-\alpha$, that $\alpha$ bits and soft syndrome values and $\beta$ bits and soft syndrome values correspond to a coded part and non-coded part respectively, said numbers $\alpha$ or $\beta$ being representative of the possible coding mode used;

maximising said likelihood value as a function of one of said numbers representative of said possible coding mode used, which enables the actual coding mode used to transmit said digital data to be determined for the maximum value of said likelihood value.

2. The method of claim 1, wherein for a sequence of n successive bits obtained on the basis of real values at the output of a decoder, said soft syndrome value is defined by the likelihood of the hard syndrome, the hard syndrome value, for said sequence of bits, being defined as the exclusive OR product of the product of transmission errors and the generator polynomials of said convolutional coding.

3. The method of claim 2, wherein said soft syndrome value $L(s_n)$ verifies the equation:

$$L(s) = L(u \oplus v) = L(u) \otimes L(v) \text{ with}$$

$$L(u) \underset{i/G_{2,i} \neq 0}{\otimes} L[Y_{n-i}^{(1)}]$$

$$L(v) \underset{i/G_{1,i} \neq 0}{\otimes} L[Y_{n-i}^{(2)}]$$

where $L[Y_{n-i}^{(1)}]$ and $L[Y_{n-i}^{(2)}]$ denote the Log-probability of two values of consecutive bits in said sequence of successive bits and $G_{1,i \neq 0}$ and $G_{2,i \neq 0}$ represent the non-zero coefficients of the generator polynomials of said convolutional coding.

4. The method of claim 1, wherein for the respective laws of distribution of the soft syndrome values written:

$$N(x, -m, \sigma) \text{ and } \frac{1}{2}[N(x; -m, \sigma) + N(x; +m, \sigma)]$$

for the coded or non-coded part respectively where $N(x,m,\sigma)$ is a Gaussian law of distribution written:

$$N(x; m, \sigma) = \frac{1}{\sigma\sqrt{2\pi}} e^{\frac{(x-m)^2}{2\sigma^2}}$$

having a mean value m and variance $\sigma$, the likelihood value of the sequence of soft syndromes verifies the equation:

$$f(\beta) = Cste \times \frac{1}{2^\beta} \prod_{i=0}^{\beta-1} \left[1 + \exp\left(\frac{2m}{\sigma^2}\lambda_{n-i}\right)\right]$$

where $\lambda_{n-i} = L(s_{n-i})$, i=1, 2, ..., n.

* * * * *